(12) United States Patent
Miller et al.

(10) Patent No.: US 7,995,002 B2
(45) Date of Patent: Aug. 9, 2011

(54) TILED PASSIVE MATRIX ELECTRO-LUMINESCENT DISPLAY

(75) Inventors: Michael E. Miller, Honeoye Falls, NY (US); Andrew D. Arnold, Hilton, NY (US); John F. Hamilton, Jr., Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 854 days.

(21) Appl. No.: 11/857,634

(22) Filed: Sep. 19, 2007

(65) Prior Publication Data

US 2009/0073079 A1    Mar. 19, 2009

(51) Int. Cl.
*G09G 5/00* (2006.01)
(52) U.S. Cl. ......................................................... 345/1.3
(58) Field of Classification Search ..................... 345/1.3
See application file for complete search history.

(56) References Cited

U.S. PATENT DOCUMENTS

| | | | |
|---|---|---|---|
| 5,668,569 A | 9/1997 | Greene et al. | |
| 6,271,825 B1 * | 8/2001 | Greene et al. | 345/694 |
| 6,292,157 B1 | 9/2001 | Greene et al. | |
| 6,509,941 B2 | 1/2003 | Freidhoff et al. | |
| 6,853,411 B2 | 2/2005 | Freidhoff et al. | |
| 6,980,182 B1 | 12/2005 | Nimmer et al. | |
| 2003/0117545 A1 * | 6/2003 | Coker et al. | 349/61 |
| 2004/0125046 A1 * | 7/2004 | Yamazaki et al. | 345/1.3 |
| 2005/0179707 A1 | 8/2005 | Ando | |
| 2006/0108918 A1 | 5/2006 | Cok et al. | |

FOREIGN PATENT DOCUMENTS

| | | |
|---|---|---|
| EP | 1 408 479 | 4/2004 |
| EP | 1 555 648 | 7/2005 |
| GB | 2 429 565 | 8/2005 |
| WO | 2006/035246 | 4/2006 |
| WO | 2006/065248 | 4/2006 |
| WO | 2006/067520 | 6/2006 |

* cited by examiner

*Primary Examiner* — Richard Hjerpe
*Assistant Examiner* — Jeffrey Parker
(74) *Attorney, Agent, or Firm* — Morgan, Lewis & Bockius LLP

(57) ABSTRACT

A tiled, passive-matrix, EL display, including two or more EL tiles, each EL tile including an array of rows and columns of light-emitting elements, each light-emitting element being formed from a light-emitting layer that is sandwiched between an orthogonal array of row and column electrodes wherein each of the two or more EL tiles further include at least one row driver; at least one column driver for operating in conjunction with each of the at least one row drivers to control the flow of electrons between the row and column electrodes to control the emission of light from each of the light-emitting elements, with a first exception that when the boundary between the two tiles is to be illuminated, then the number of rows of simultaneously illuminated rows of light-emitting elements within one tile is less than the predetermined number.

17 Claims, 11 Drawing Sheets

TILED PASSIVE MATRIX ELECTRO-LUMINESCENT DISPLAY

CROSS REFERENCE TO RELATED APPLICATIONS

Reference is made to commonly assigned U.S. patent application Ser. No. 11/737,736, filed Apr. 20, 2007, by Michael Eugene Miller et al., entitled "Passive Matrix Electro-Luminescent Display System", the disclosure of which is incorporated herein.

FIELD OF THE INVENTION

The present invention relates to passive matrix electro-luminescent displays. Particularly, the present invention relates to a tiled passive matrix display that is driven without visible boundaries between adjacent tiles.

BACKGROUND OF THE INVENTION

Many display devices exist within the market today. Among the displays that are available are thin-film, coated, Electro-Luminescent (EL) displays, such as OLED displays. These displays can be driven using active matrix backplanes, which employ an array of active circuits. These active circuits control the flow of current to each light-emitting element in the display. However, these displays tend to be relatively expensive due to the complexity of forming an active circuit at each light-emitting element and the thin film transistors that are often used within these active drive circuits are prone to defects, leading to lack of uniformity or threshold shifts over time, which degrade the quality of the display.

Passive matrix thin-film, coated, electro-luminescent displays are also known. Unfortunately, these displays typically allow only one line of the display to be driven simultaneously, typically using pulse width modulation. Further, it is typically necessary in these devices to discharge and charge the capacitance of each light-emitting element before each lighting cycle. For these reasons, passive matrix, thin-film, coated electro-luminescent displays typically draw excessive amounts of power and often require drive voltages that are larger than can be provided by row and column drivers that are manufactured using low-cost silicon manufacturing processes whenever the displays exceed some dimension, which today is less than 2 inches in diagonal.

Recently, multiline passive matrix drive methods that are applicable to EL displays have also been discussed in the literature. Among these approaches, are a method described by Yamazaki et al. in U.S. patent application Ser. No. 10/680,221, entitled "Image Display Apparatus" and a separate method described by Smith et al. in PCT filings WO 2006/035246 entitled "Multi-Line Addressing Methods and Apparatus", WO 2006/035248 entitled "Multi-Line Addressing Methods and Apparatus" and WO 2006/067520 entitled "Digital Signal Processing Methods and Apparatus". Each of these methods can be used to significantly reduce the current through each light-emitting element within an EL display and to potentially reduce the peak current on individual row lines. This then reduces power losses due to the resistance of the row and column electrodes within these displays and, under certain drive conditions, can also reduce the power dissipated to charge and discharge the capacitance of the display, making it possible to build larger passive matrix EL displays with reasonable power dissipation. Unfortunately, these methods often introduce some errors into the data signal, which can result in image artifacts under certain conditions. Further, they only allow the size of passive matrix EL displays to be increased by a factor of a few, rather than a factor of 10 or more as would be desired.

Another method for forming larger passive matrix displays is to form several individual displays or displays with multiple row and column drivers, which serve as tiles that are bonded together to form a larger EL display. Such tiled displays are well known in the art. For example, Nimmer et al. in U.S. Pat. No. 6,980,182, entitled "Display System" and Cok et al. in U.S. Pub. No. 2006/0108918, entitled "Tiled OLED Display" each discuss forming a single display substrate to which multiple row and column drivers can be attached to provide a tiled display with a larger area than can be achieved using a single display employing a single row and column driver. Such a method allows multiple EL tiles to be formed by coating uniform light-emitting layers, eliminating a significant source of non-uniformity between tiles. Such an arrangement is beneficial in passive-matrix EL displays since each row driver provides a signal to only a subset of the row electrodes within the final tiled display. Since the number of times that the capacitance of such a display must be charged and discharged is proportional to the number of lines that are driven and the power dissipated by such a display when using a one line at a time passive matrix drive method increases by approximately the square of the number of lines that are driven, such a method allows the drivers to drive half the total lines in the display and can, therefore, significantly reduce the power consumption of the display, again allowing the size of a display having reasonable power consumption to be increased by a factor of 2 or 3. These disclosures do not discuss the combination of multi-line drive methods together with the tiling of passive matrix EL displays. Freidhoff and Phelan have discussed other tiled EL displays in U.S. Pat. No. 6,509,941, entitled "Light-Producing Display Having High Aperture Ratio Pixels" and U.S. Pat. No. 6,853,411, entitled "Light-Producing High Aperture Ratio Displays Having Aligned Tiles".

One issue with tiled displays, is that an input image signal 122 is typically streamed into such a display in a raster fashion, starting with the data point at the top left corner of the image and then sequentially providing data for pixels in each row of the display. However, since the displays have separate row and column drivers for each tile, it is typically necessary for a higher level controller to store this input image signal as it is received, segment the input data into independent blocks and then provide each independent block of input image signal data to the row and column driver wherein each block of input image signal data will be used by the row and column drivers connected to each tile to independently render the portion of the input image signal that corresponds to the physical location of the tile within the display. For example, in U.S. patent application Ser. No. 10/158,321, by Koester et al. and U.S. patent application Ser. No. 10/249,954 by Lin, each discuss using a processor to store and reorganize the input image signal into multiple, independent blocks wherein each block is independently distributed to the row and column drivers for each tile.

One of the dominant problems in such displays arises because the human visual system is extremely sensitive to changes in luminance or artificial luminance edges that occur near the boundary between adjacent tiles. It is known to sort tiles to reduce luminance differences as discussed by Greene et al., in U.S. Pat. No. 5,668,569, entitled "Tiled, Flat-Panel Displays with Luminance-Correcting Capability" and U.S. Pat. No. 6,292,157, entitled "Flat-panel Display Assembled from Pre-sorted Tiles Having Matching Color Characteristics and Color Correction Capability". Further, it is known to adjust the input image signal to reduce differences in color or luminance of images at the boundary between edges of adjacent tiles as discussed by Green et al. in U.S. Pat. No. 6,271,825, entitled "Correction Methods for Brightness in Electronic Display". In the color and luminance correction methods discussed in these patents, data describing the radiometric performance of each of the tiles that form the display are used to adjust the input image signal before this input image signal is provided each of the row and column drivers. It is worth noting that these approaches correct only for differences between the optical performances of neighboring tiles. The row and column drivers within the embodiments discussed within these disclosures operate independent of one another as each receives and responds to individual blocks of the input image signal.

SUMMARY OF THE INVENTION

In accordance with the present invention, there is provided a tiled, passive-matrix, EL display, including:
 a) two or more EL tiles, each EL tile including an array of rows and columns of light-emitting elements, each light-emitting element being formed from a light-emitting layer that is sandwiched between an orthogonal array of row and column electrodes wherein each of the two or more EL tiles further include at least one row driver;
 b) at least one column driver for operating in conjunction with each of the at least one row drivers to control the flow of electrons between the row and column electrodes to control the emission of light from each of the light-emitting elements; and
 c) one or more controllers coupled to the row drivers and column driver(s) for receiving an input image signal and for simultaneously providing row drive signals to the two or more drivers within the two or more EL tiles to control the flow of electrons through the row and column electrodes to simultaneously illuminate a predetermined number of rows of light-emitting elements within the two or more EL tiles, with a first exception that when the boundary between the two tiles is to be illuminated, then the number of rows of simultaneously illuminated rows of light-emitting elements within one tile is less than the predetermined number.

While attempting to utilize a combination of tiling and multiline drive methods for passive matrix EL displays, it has been discovered that the existing multiline drive methods produce visible luminance artifacts at the boundary between adjacent tiles. The present invention allows one to utilize methods for driving multiple lines of a passive matrix EL display together with the methods for tiling EL displays to gain the combined advantages of each of these methods without introducing these visible artifacts. As the use of both tiling and multiline drive methods can be used to produce larger passive matrix EL displays, which dissipate less power than single-driver, single line at a time passive matrix drive schemes, the combination allows even larger passive matrix EL displays to be formed with acceptable power consumption. The present invention can therefore enable higher resolution, larger, and more valuable passive matrix, EL displays than can be produced by applying tiling or multi-line addressing alone, without producing objectionable luminance artifacts at the boundaries between the tiles.

DETAILED DESCRIPTION OF THE INVENTION

Figure 1:
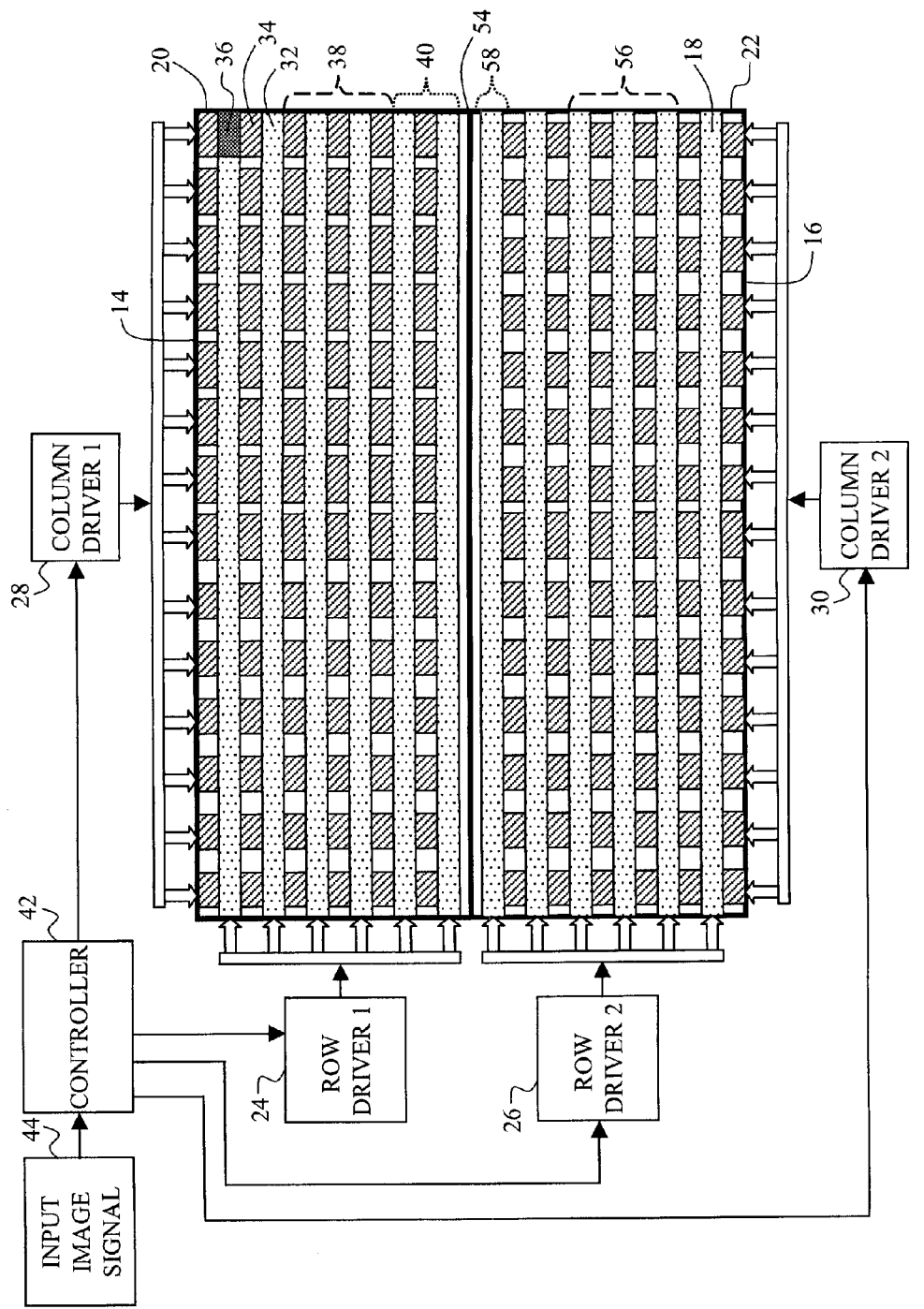
FIG. 1 is a schematic diagram of a tiled, passive-matrix, EL display according to one embodiment of the present invention.

The need is met by providing a tiled, passive-matrix, EL display, wherein the luminance errors that result when using a multi-line driving method for driving a passive-matrix EL display are distributed across the boundary between the two or more adjacent tiles and are shared across multiple rows of light-emitting elements rather than being concentrated near the boundary of the two or more adjacent tiles. This can be accomplished by applying the tiled, passive-matrix EL display shown in FIG. 1, which includes two or more EL tiles 20, 22, each EL tile 20, 22 includes an array of rows and columns of light-emitting elements 36, each light-emitting element 36 being formed from a light-emitting layer that is sandwiched between an orthogonal array of row 32 and column 34 electrodes. Each EL tile 20, 22 further include at least one row driver 24, 26. The tiled, passive-matrix EL display additionally includes at least one column driver 28, 30 for operating in conjunction with each of the at least one row drivers 24, 26 in each EL tile 20, 22 to control the flow of electrons between the row and column electrodes 32, 34 to control the emission of light from each of the light-emitting elements 36. The tiled, passive-matrix EL display additionally includes one or more controllers 42, coupled to the row 24, 26 and column 28, 30 drivers, for receiving an input image signal 44 and for simultaneously providing a predetermined number of row drive signals to two or more row drivers 24, 26 within the two or more EL tiles 20, 22 to simultaneously illuminate a predetermined number of rows of light-emitting elements, depicted as the group 38 in FIG. 1, within the two or more EL tiles. However the controller illuminates this predetermined number of rows of light-emitting elements during each frame with the exception that when the boundary 54 between the two EL tiles 20, 22 is to be illuminated, then the number of rows of simultaneously illuminated rows of light-emitting elements within one tile is less than the predetermined number, as depicted a group 40 of rows of light-emitting elements.

It is important to define the use of the term "boundary" and to define what it means to illuminate the boundary. Within this disclosure, the "boundary" 54 refers to the region between two adjacent row electrodes, which are on adjacent edges of neighboring EL tiles 20, 22. This boundary 54 will typically be illuminated when each of the two adjacent row electrodes on adjacent edges of neighboring EL tiles simultaneously emit light. However, it is not strictly required that these two adjacent row electrodes simultaneously emit light for the boundary to be illuminated. It is required, however, for the row of light-emitting elements furthest from this boundary that is illuminated to be less than the predetermined number of rows of light-emitting elements from the boundary. The time interval over which any group of row electrodes are energized will be referred to as a "field". In traditional passive matrix drive methods, this time interval typically includes a pre-charge time for charging the capacitance of the EL light-emitting elements of the display, an active time, during which the light-emitting elements emit light and a discharge time, during which the capacitance of the light-emitting elements is discharged. However, a field may include only the time between the time that one group of rows of light-emitting elements are illuminated and the time that a second group of rows of light-emitting elements are illuminated.

Figure 2:
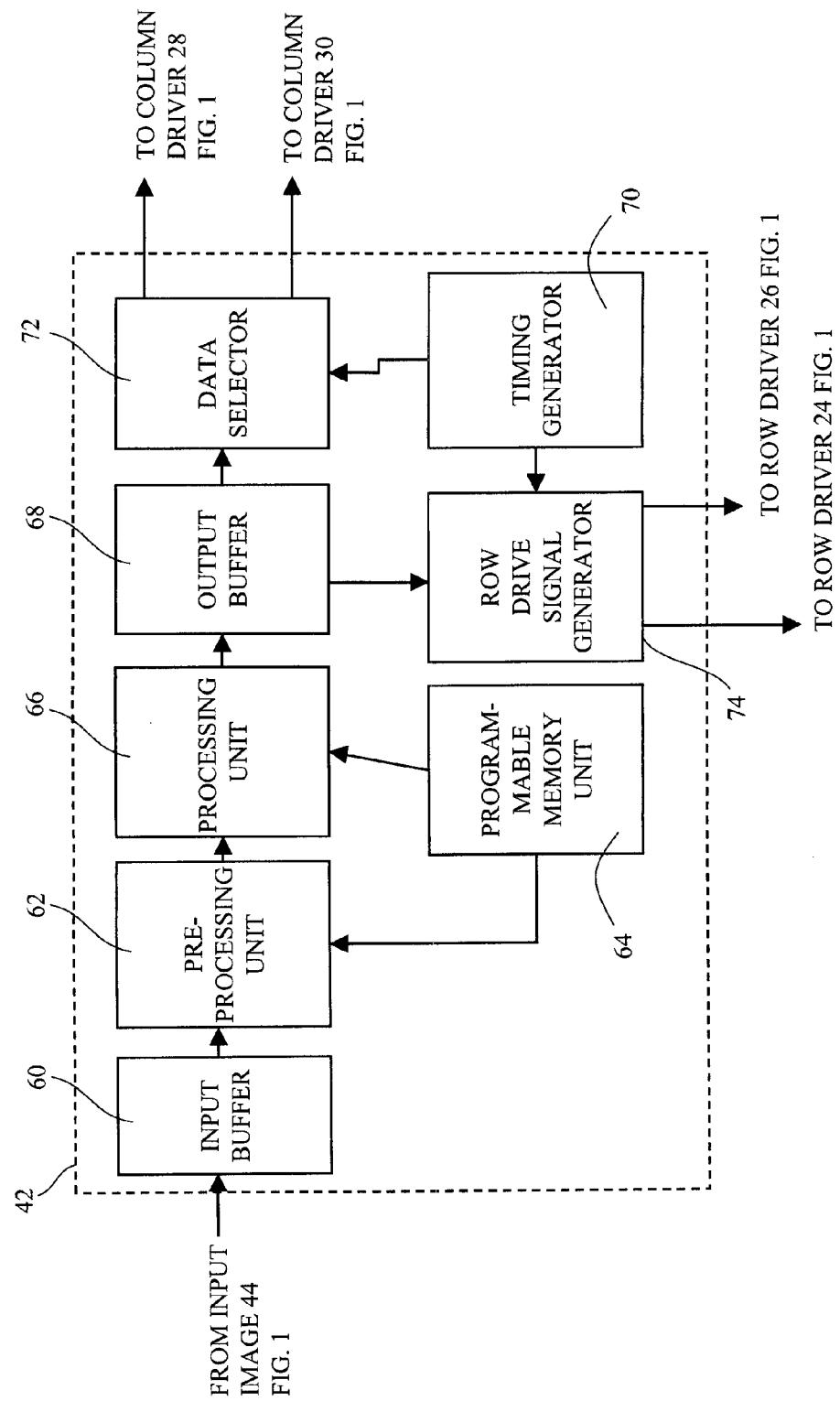
FIG. 2 is a schematic diagram of a controller useful in one embodiment of the present invention.

A controller of the present invention will typically include the components as shown in FIG. 2. First, the controller includes an element for receiving the input image signal 44. The controller 42 will further include an input buffer 60 for storing at least a portion of the input image signal. Typically, this input buffer 60 can store up to one full frame of image information. The controller 42 can include a preprocessing unit 62. This preprocessing unit 62 can perform several potential image manipulations, such as linearizing the input image signal 44 and correcting the input image signal 44 to compensate for differences in luminance output between adjacent EL tiles 20, 22. Such corrections are known in the art as discussed earlier. A programmable memory unit 64 is available to store information regarding the performance of each EL unit, which is required to allow the preprocessing unit 62 to correct for differences in luminance output between the adjacent EL tiles.

The controller 42 includes a processing unit 66 for converting the preprocessed input image signal to form signals appropriate for simultaneously driving multiple row electrodes within the tiled, passive-matrix, EL display. These signals will include signals for driving both the row and column drivers. This processing unit 66 can acquire row drive values and other information, such as sharpening kernels, from the programmable memory to facilitate this processing. This processing unit 66 within the controller 42, therefore, processes the input image signals before their application to the row and column drivers. This processing unit 66 can perform steps such as sharpening to facilitate multiline addressing as described in U.S. Ser. No. 11/737,786, filed Apr. 20, 2007, entitled "Passive Matrix Electro-luminescent display system", or in Yamazaki et al. in U.S. patent application Ser. No. 10/680,221, entitled "Image Display Apparatus", each of which are hereby included in full by reference. Alternately, the processing unit 66 can perform other image processing operations for creating a signal appropriate for multi-line addressing, such as image decompositions. Smith et al. have previously described one such image decomposition method in PCT filings WO 2006/035246 entitled "Multi-line addressing methods and apparatus".

An output buffer 68 within the controller 42 then stores the processed data. A timing generator 70 then provides timing signals to both a row drive signal generator 74 and a data selector 72. The data selector 72 then acquires data from the output buffer 68 and provides it to the column drivers 28 and 30. Simultaneously, the row drive signal generator 74 acquires data from the output buffer 68 and provides it to the row drivers 24, and 26. Applying these components, the controller 42 acquires the input image signal and can provide variable drive signals to both the row and column drivers to drive the display according to the present invention.

In a typical embodiment, the controller 42 controls the row 24, 26 and column 28, 30 drivers, such that a predetermined number of row drive signals will be provided within the two or more EL tiles 20, 22 to illuminate a group 38, 56 of two or more rows of light-emitting elements within each EL tile. It is desirable for this group of rows of light-emitting elements to be simultaneously activated within each of the tiles of the display. For instance, beginning at the top of each tile of the display, this predetermined number of rows of light-emitting elements can be activated. In a subsequent field, a different group of the predetermined number of rows of light-emitting elements will be activated within each tile. This different group of rows of light-emitting elements can, for example, overlap the first group of rows of light-emitting elements by all but one row. In subsequent fields, a new group of rows of light-emitting elements can be activated during each field, simply being offset by one row as they are scanned down each tile. Alternately, the subsequent groups may be selected such that there is no overlap between the rows of illuminated light-emitting elements within two subsequent fields or there may be some intermediate degree of overlap. Once the last row electrode in each of the EL tiles 20, 22 is activated for a first time, the first exception occurs. During this time, a smaller group of rows of light-emitting elements can be illuminated within the first tile 20, which overlaps the previous group with the exception that top row of light-emitting elements from the previous field is not illuminated. At the same time, only the first row of light-emitting elements in the second EL tile 22 will typically be illuminated. This allows the luminance from a group of rows of light-emitting elements to produce luminance across the boundary between the two tiles, and therefore distribute luminance across this boundary. It is important that during this exception, the first column driver 28 and the second column driver 30 will typically provide exactly the save drive values to the column electrodes in the first tile 20 and the column electrodes in the second tile 22. Although, the active rows of light-emitting elements bridge the boundary between the two tiles 20, 22, this might be thought of as a single, continuous group of rows of light-emitting elements. Therefore, it might be observed that the display will generally activate multiple groups of light-emitting elements 38, 56, one in each tile, when the groups are fully contained within a tile but will activate only one group of rows of light-emitting elements whenever the group bridges a boundary between two adjacent tiles. When driven in this way, the total of the number of rows of light-emitting elements that are simultaneously illuminated on a display that includes two EL tiles is equal to the predetermined number of row drive signals when the boundary is illuminated. For example, the group, which bridges a boundary between two adjacent tiles, can include the rows of light-emitting elements in the group 58. Notice that only one boundary of any tile will typically be illuminated at one time. Therefore, if there was a third tile below tile 22, one might illuminate the boundary 54 between tiles 20 and 22 in one set of fields but then illuminate the boundary between tile 22 and the third tile (not shown) in a separate set of fields. Illumination of the boundary will then proceed as the group of rows of light-emitting elements is scanned from the first tile to the second tile.

Typically, a second exception will also occur in such a display, as it is desirable to render the full image information onto the top row of light emitting elements, driven by the top row electrode 32 of the display and the bottom row of light-emitting elements, which are driven by the bottom row electrode 18 of the display. Notice that as shown in FIG. 1, there are at least two EL tiles having the boundary 54 between the at least two EL tiles 20, 22 and further, the two tiles 20, 22 each have an edge 14, 16 opposite to the boundary. When simultaneously illuminating the opposite edges of each tile, the number of row drive signals provided to the two or more row drivers within at least one of the EL tiles is less than the predetermined number within one tile. During this time, as when illuminating the boundary, the number of rows of light-emitting elements that simultaneously produce light will be fewer within any tile than when illuminating rows of light-emitting element that are not adjacent to an edge of a tile that is parallel to the row electrodes.

It is worth noting that within the previous example, at least one light-emitting element within each tile is controlled to emit light during each field. When the group of rows of light-emitting elements is not adjacent to an edge of the tile that is parallel to the row electrodes, the predetermined number of rows of light-emitting elements is generally active within each of the EL tiles. When the group of rows of light-emitting elements within each tile is adjacent to an edge of the tile that is parallel to the row electrodes, fewer rows of light, emitting elements will be illuminated. However, the fact that some of the light-emitting elements in each tile are active during each field is important as it reduces the number of fields that must be presented to form an image, the current required to produce a desired illumination is proportional to the number of required fields and the power consumption of the display is generally proportional to the square of the number of required fields. Therefore, the fact that at least one light-emitting element within each tile is controlled to emit light during each field, reduces the power consumption of the display.

Within a desired embodiment of the present invention, both the column and row drivers will provide different drive signals to the row electrodes within any group 38 of row electrodes. Any group of simultaneously illuminated light-emitting elements that are defined by the intersection of multiple, simultaneously controlled row electrodes and a single column electrode will have different luminance levels. Therefore, the luminance level of a light-emitting element within a group of simultaneously activated light-emitting element corresponding to the intersection of a single column electrode with a plurality of row electrodes will be brighter than the other light-emitting elements within the group.

As shown in FIG. 1, the tiled, passive-matrix, EL display includes a single controller. This will often be desirable to reduce the cost of the overall system. However, this is not required. Each tile or a subset of tiles can each have their own controller. However, in these embodiments, it will be important to provide one controller for buffering and parsing the input image signal before providing it to the additional controllers. In such a system, it will also be important for the controllers for each tile or subset of tiles to not only be aware of the portion of the input image signal that corresponds to the spatial location of the tile within the overall display but the controller must also be aware of the portion of the input image signal that corresponds to the spatial location of light-emitting elements near the boundary within neighboring tiles. In such a system, the controller for any given tile can use the information corresponding to the spatial location of light-emitting elements near the boundary within neighboring tiles to appropriately illuminate the boundary according to the present invention.

It is possible to form the tiles 20, 22 either on separate substrates, manufacturing one at a time, or to form the tiles 20, 22 on a single substrate. Generally, it is desirable to form a at least a portion of the two or more tiles on a single substrate as variation often exists in the coating processes that can be used to form individual EL tiles. This variation can produce luminance differences between neighboring tiles, which must somehow be compensated for to avoid visible artifacts and the tile boundaries. Additionally, if the tiles are formed on separate substrates, it can be advantageous to encapsulate individual tiles before assembling these tiles into the final display. Such encapsulation processes typically require access to the edges of the tile, which will often force the distance between neighboring light-emitting elements at the tile boundary to be further apart than neighboring light-emitting elements within any tile. Forming multiple tiles on a single substrate can also eliminate this issue.

Figure 3:
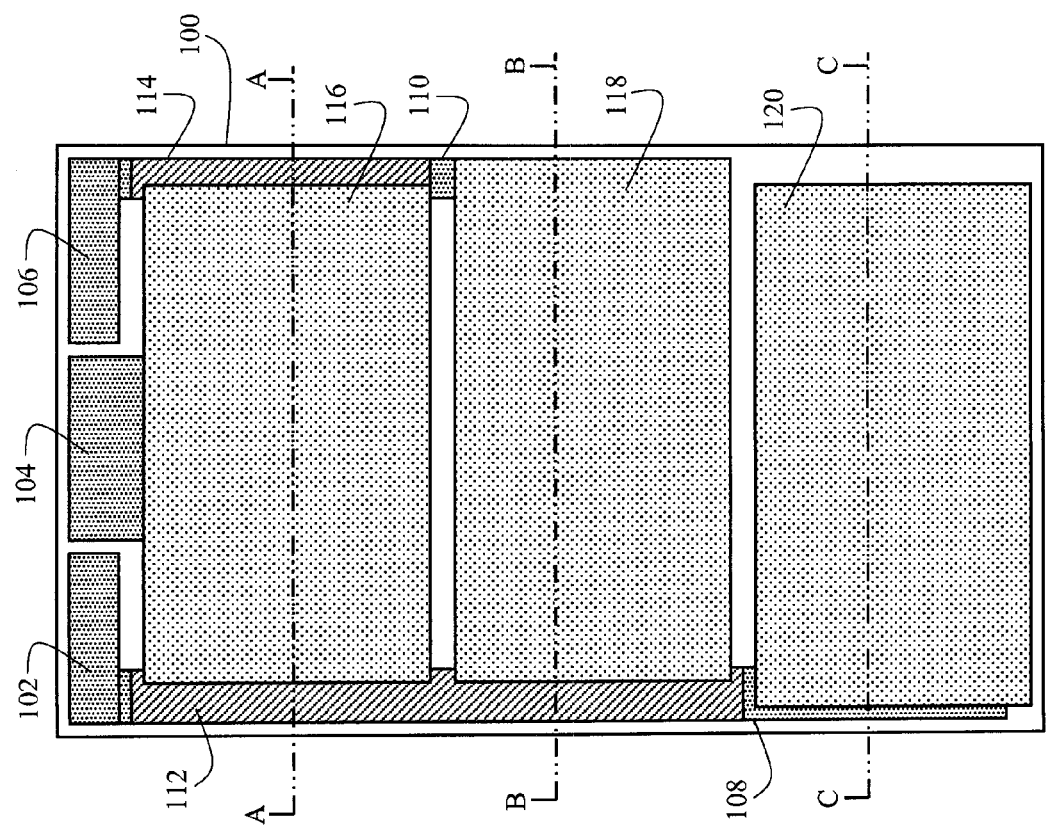
FIG. 3 is a schematic diagram of a column of a tiled, passive matrix, EL display including three EL tiles on a single substrate.
Figure 5A:
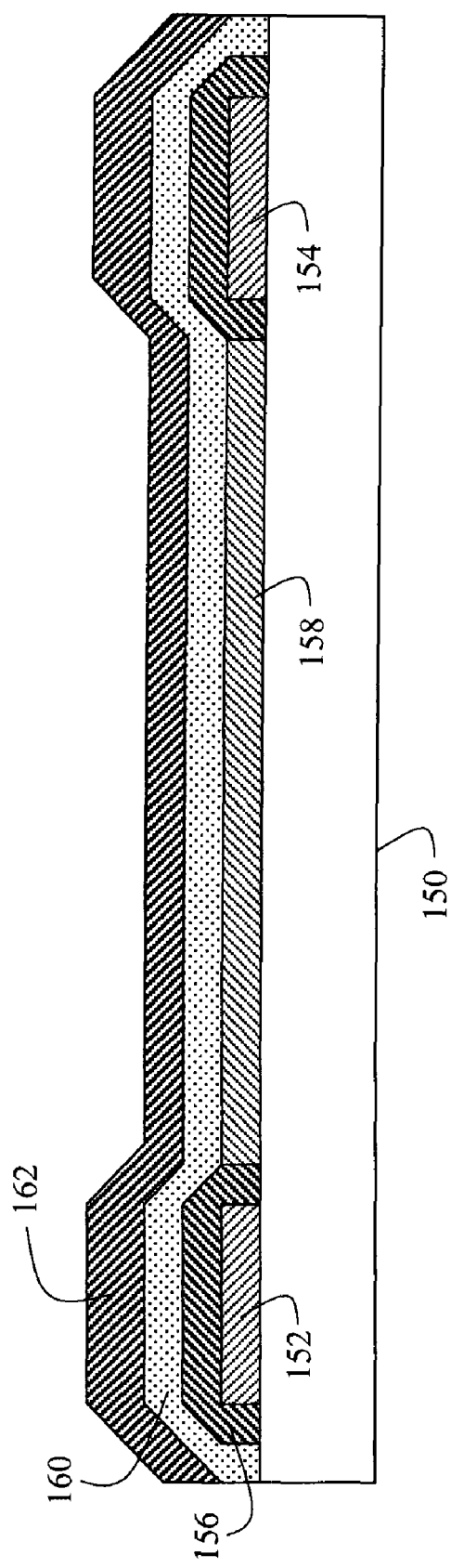
FIG. 5a is a cross-sectional diagram of the column taken along the lines A-A in FIG. 3.
Figure 5B:
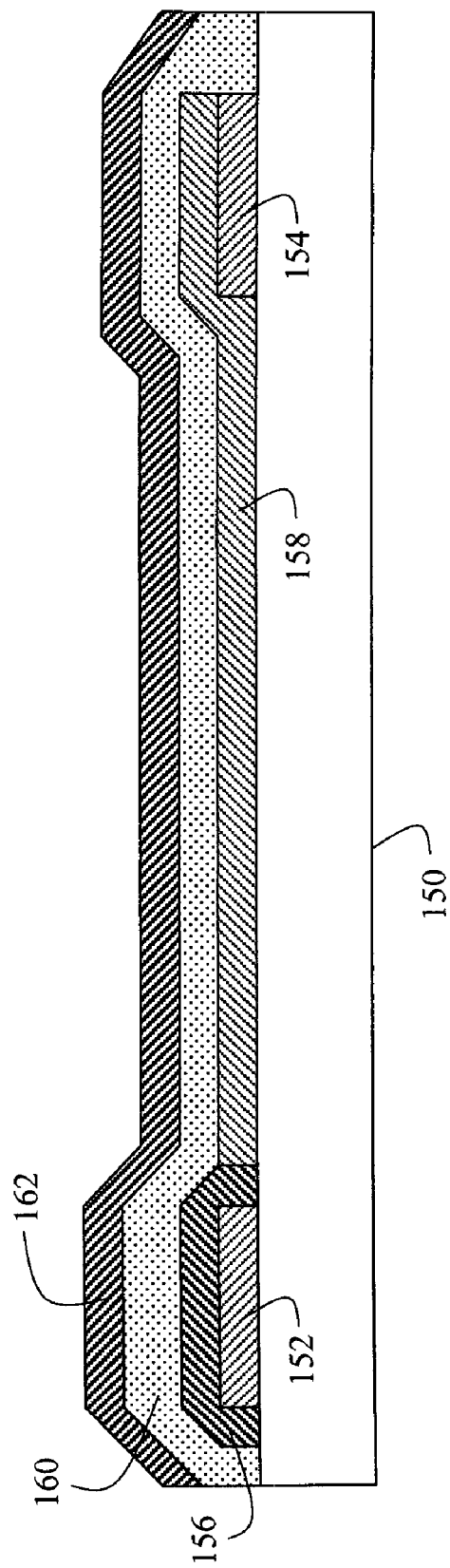
FIG. 5b is a cross-sectional diagram of the column taken along the lines B-B in FIG. 3.
Figure 5C:
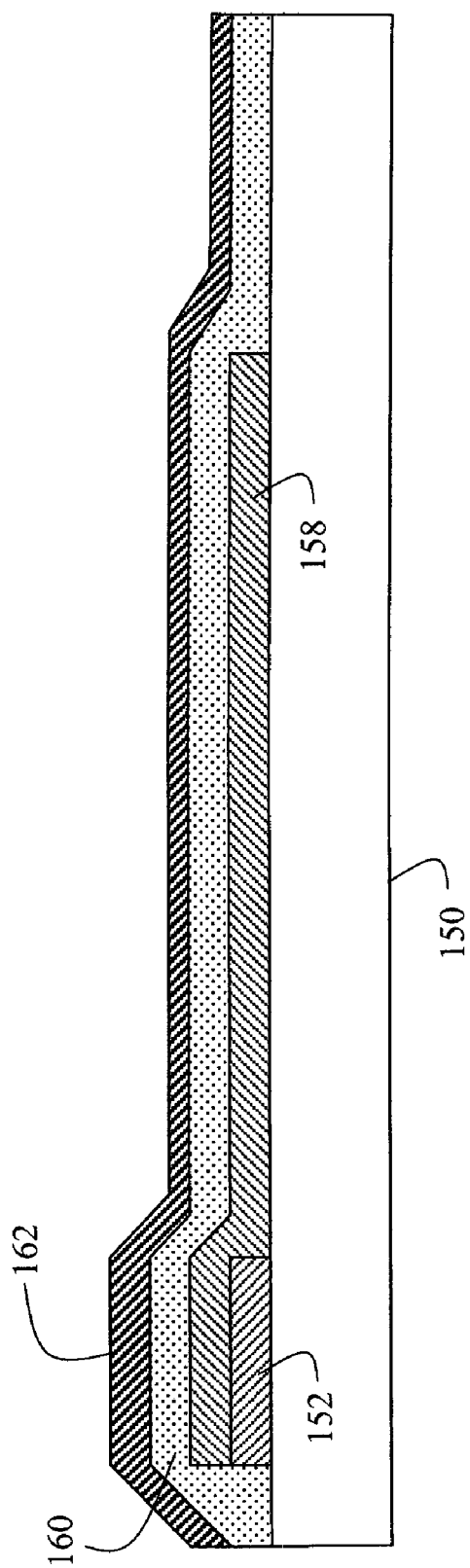
FIG. 5c is a cross-sectional diagram of the column taken along the lines C-C in FIG. 3.

The formation of multiple tiles on a single substrate can be accomplished in multiple ways. FIG. 3 depicts a portion of a substrate for forming a display having multiple EL tiles. To further aid the understanding of this structure, three cross sectional diagrams of a display employing this structure are shown in FIGS. 5a, 5b, and 5c wherein the display is cross-sectioned at parting lines A-A, B-B and C-C. Specifically, this figure depicts a single column of such a substrate. This figure is not drawn to scale but instead the width of the column has been magnified much more than the height to allow the features of this substrate to be seen. The substrate will be formed by beginning with a base substrate 100 material, such as glass. Over this base substrate, a metal layer will be formed which is patterned to provide multiple driver connections 102, 104, 106, as well as metal tile connectors 108, 110. The drive connections 102, 104, 106, provide highly conductive metal traces from the top of the column electrodes to the drivers. Their purpose is to provide a low resistivity connection of the column driver to the column electrodes. The metal tile connectors 108, 110 provide relatively narrow but highly conductive traces for providing current to individual EL tiles within the display. Insulating layers 112, 114 are then patterned over a portion of at least one of the metal tile connectors 108, 110. These insulating layers electrically isolate at least a portion of at least one of the metal tile connectors 108, 110 from subsequent layers of the device structure. Another conductive material, ideally transparent conductive material, such as Indium Tin Oxide (ITO) is then deposited onto the substrate. This ITO layer is preferably patterned such that it forms multiple islands, wherein each island is electrically connected to only one of either the drive connections or the metal tile connectors. As shown in this figure, within this one column, three islands of ITO are formed, including 116, 118, and 120. As shown, ITO island 116 is formed to be electrically connected to the driver connection 104 and electrically isolated from the metal tile connectors 108, 110 from the insulating layers 112, 114. ITO island 118 is in electrical contact with the metal tile connector 110 but is insulated from the metal tile connector 108 by insulating layer 112. Notice that each of the ITO islands is electrically isolated from other columns as they are patterned to remain within the column shown in FIG. 3. Although not shown in this figure, an electro-luminescent layer would then be formed over this substrate and an array of row electrodes would be patterned over each of the ITO islands 116, 118, 120. Notice that passive matrix EL displays are typically formed as bottom-emitting displays and emit light through a glass substrate. Therefore, the presence of the metal layer will reduce the area of the light-emitting element that can be viewed by the user. However, passive matrix displays are typically designed so that a subset of the light-emitting elements in any column are active at any point in time and therefore, the current required to drive a column of light-emitting elements is relatively small. Further, metal is often on the order of 100 times more conductive than ITO, which is typically used to form column electrodes in passive matrix displays. Therefore, the metal tile connectors 108, 110 can be significantly narrower than the ITO within the pixel area. For instance these metal tile connectors can be less than $10^{th}$ the separation between the visible edges between any two neighboring light-emitting elements.

Figure 4:
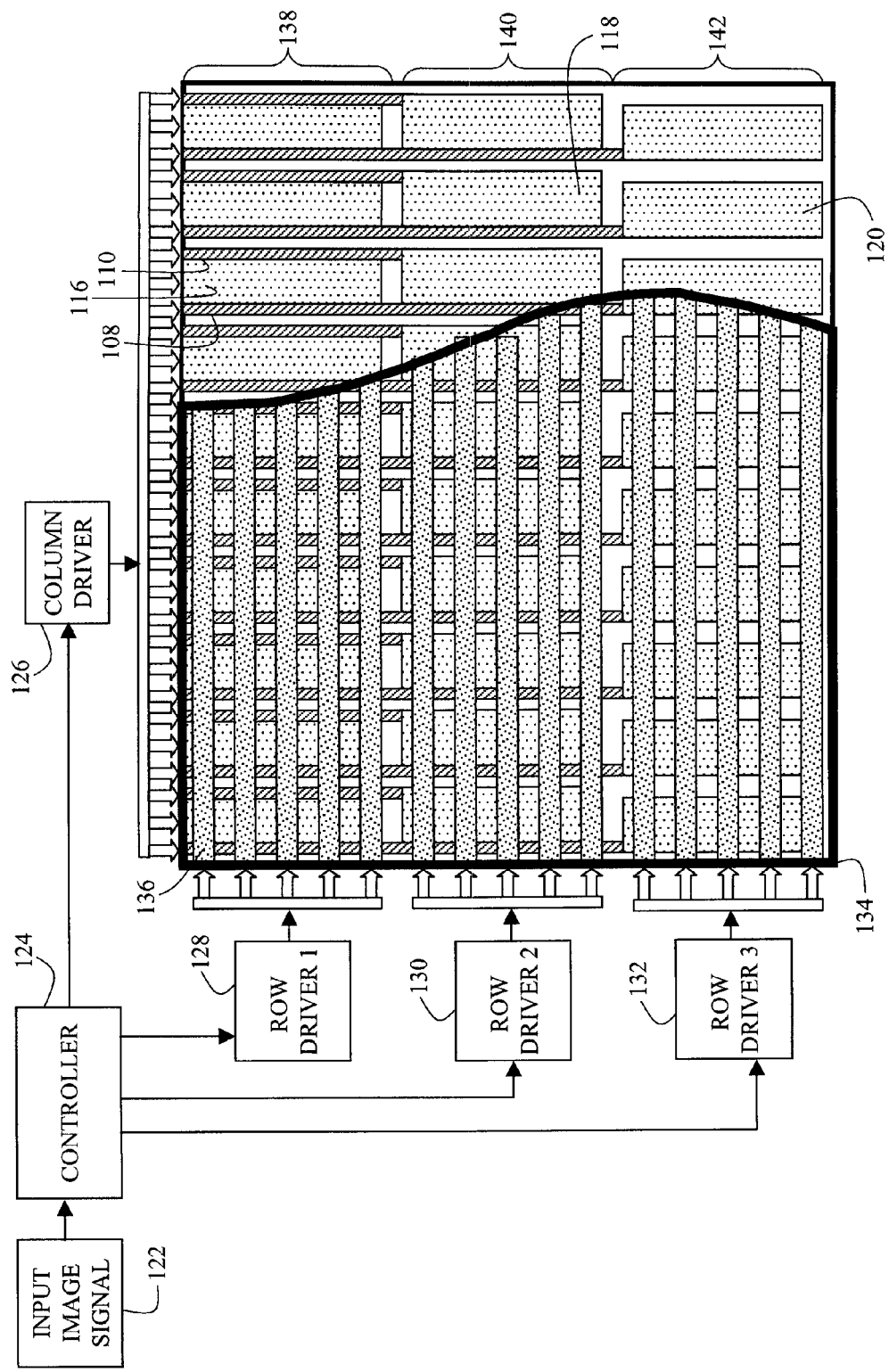
FIG. 4 is a schematic diagram of a display employing the three EL tiles constructed on a single substrate as depicted in FIG. 3.

A display using a tiled arrangement such as shown in FIG. 3, can include a controller 124 for receiving an input image signal and creating signals to control the row and column drivers, a column driver 126, and multiple row drivers 128, 130, 132 as shown in FIG. 4. However, the display will include three tiles, as the ITO islands 116, 118, 120 each effectively serve as an independently addressable column electrode and multiple, independently addressable row electrodes 136 will be formed orthogonal to these addressable column electrodes, and so the final display 134 will include three separate tiles 138, 140, 142 of light-emitting elements that are addressed by independent groups of row and column electrodes. As shown in FIG. 4, each of the three tiles 138, 140, 142 are as wide as the display 134 and as tall as the ITO islands 116, 118, and 120.

Looking at FIGS. 3 and 4, it is important that the column driver is now only attached to one side of the display, allowing the tiled, passive-matrix EL display having three tiles to be driven with a single column driver 126. In this arrangement, it is possible to form even a larger display by using a similar electrode layout but attaching column drivers to both the top and bottom of the tiled, passive-matrix EL display. In such an arrangement, the display can be extended to have six vertically arranged tiles while using metal tile connectors 108, 110 in the same arrangement as shown in FIG. 3. Further, these metal tile connectors 108, 110 and the insulating layers 112, 114 can be each patterned in a common patterning step, regardless of the number of each of these. It can be further noted that it is possible to form further tiles by forming additional metal tile connectors. While FIG. 3 shows one such metal tile connector one either edge of a column, two or even more metal tile connectors can be included on either edge of a column, providing a further increase in the number of tiles per substrate.

Cross-sections of the display shown in FIG. 3 are shown in FIGS. 5a, 5b and 5c. FIG. 5a shows a cross section at FIG. 5a. As shown in this figure, the structure begins with a substrate on which is deposited two metal tile connectors 152, 154. Typically, sputtering a metal layer over the entire substrate and then applying photolithography to remove all but these lines of metal will deposit these. Within this first tile, neither of these metal tile connectors 152, 154 provides current to the column electrode and so an insulating layer 156 is deposited over these metal tile connectors. Once again, this insulating layer is likely deposited as a sheet using coating methods such as vapor deposition or sputtering. This layer can be patterned using photolithography as shown but it can be left to cover the entire substrate. An ITO layer 158 is then deposited and patterned to form an island, typically using photolithography. This layer will function as the column electrode. An electroluminescent layer 160 is then deposited over at least the ITO layer 158. Finally, a metal layer 162 is applied to form the row electrodes. Although not shown within this segment, other structures can also be formed at other parting line. For instance a pillar structure can be formed parallel to the row electrodes, which is tall enough to produce separation within the metal layer 162 to form discrete row lines. Such pillar structures are commonly applied within the manufacture of passive matrix Organic Light Emitting Diode (OLED) displays and are well known in the art.

FIG. 5b shows a cross section of the device structure shown in FIG. 3 at the parting line B-B. This figure is very similar to the cross sectional diagram in FIG. 5a. However, there are two very significant differences. First note that the insulating layer 156 has been removed from above the metal tile connector 154. Secondly, the ITO layer 158 extends over the metal tile connector 154 and therefore allows electrical connection between this metal tile connector and the island of ITO 118. As such, the drive signal that is provided on the metal tile connector 110 of FIG. 3, serves as the drive signal for the column electrode within this tile.

FIG. 5c shows a cross-section of the device structure shown in FIG. 3 at the parting line C-C. At this location, it is important for the third ITO island 120 in FIG. 3 to be connected to the metal tile connector 108 but not to any other metal tile connector. As shown in FIG. 5c, depositing only one metal tile connector 152 within this region and removing the entire insulating layer 156 can accomplish this. Finally, the ITO layer 158 can be formed in electrical contact with the metal tile connector 152.

It should be noted that in most displays, other image processing must also be performed in addition to that described earlier. For example, in displays employing arrays of RGBW light-emitting elements as described in U.S. patent application Ser. No. 10/320,195, it will be advantageous for the pre-processing unit 62 to receive a RGB input image signal, linearize the RGB input image signal with respect to aim display luminance, convert the linearized RGB input image signal into a linearized RGBW input signal.

Within the embodiments of the present invention, the controller 42 will typically be one ore more digital processors. This 42 controller can be formed as a dedicated device or it can be embedded within other digital processors within a device that employs the display.

The row and column drivers will generally employ some way for receiving a digital signal from the controller 42 and converting this signal to an analog voltage or current signal that is appropriate for controlling the flow of electrons along the row 32 and column 34 electrodes and through each of the light-emitting elements 36. In desirable embodiments, the row or column drivers will provide a time-multiplexed signal while the other driver will provide the ability to simply activate or deactivate the flow of current along each electrode. In other desirable embodiments at least one of the row or column drivers will provide analog control of the voltage or current flow through each of the row or column electrodes.

The tiled, passive-matrix EL display can be any electro-luminescent display that can be used to form a two dimensional array of addressable elements between a pair of electrodes. These devices can include electro-luminescent layers 160 employing purely organic small molecule or polymeric materials, typically including organic hole transport, organic light-emitting and organic electron transport layers as described in the prior art, including U.S. Pat. No. 4,769,292, issued Sep. 6, 1988 to Tang et al., and U.S. Pat. No. 5,061,569, issued Oct. 29, 1991 to VanSlyke et al. The electro-luminescent layer 160 can alternately be formed from a combination of organic and inorganic materials, typically including organic hole transport and electron transport layers in combination with inorganic light-emitting layers, such as the light-emitting layers described in U.S. Pat. No. 6,861,155 issued Mar. 1, 2005 to Bawendi et al. Alternately, the electro-luminescent layer 160 can be formed from fully inorganic materials such as the devices described in co-pending U.S. Ser. No. 11/226,622 filed Sep. 14, 2005, entitled "Quantum Dot Light Emitting Layer".

The display can further employ row and column electrodes, which are formed from an array of materials. The row electrodes, which typically, carry current to more light-emitting elements that are lit simultaneously, than the column electrodes will typically be formed of a metal. Commonly known and applied metal electrodes 32, 34 and the metal tile connectors 108, 110, of the present invention are typically formed from silver or aluminum but can be formed from other conductive metals, such as copper. When the electrode functions as a cathode, these metals can be alloyed with low work function metals or used in combination with low work function electron injection layers. At least one of the row or column electrodes must be formed of materials that are transparent or semi-transparent. Appropriate electrodes include metal oxides such as ITO and IZO or very thin metals, such as thin layers of silver. To decrease the resistivity of these electrodes, additional opaque, conductive bus bars can be formed in electrical contact with these electrodes.

The substrate can also be formed of many types of material. When the transparent or semi-transparent electrode is formed directly on the substrate, it is desirable for the substrate to be formed from a transparent material, such as glass or clear plastic. Otherwise, the substrate can be either transparent or opaque. Although not shown, such displays generally will include additional layers for mechanical, oxygen, and moisture protection. Methods of providing this type of protection are well known in the art. Also not shown within the diagrams of this disclosure, are mechanical structures, such as pillars that are commonly employed during manufacturing of passive matrix OLED displays that enable the patterning of the electrode furthest from the substrate.

Although, the current invention has been discussed specifically for EL displays, the method of the present invention can be usefully employed with alternate display technologies. Particularly any display technology requiring the flow of current, as is typical in most emissive display technologies, including field emission or surface-conduction-electron-emitter displays, can benefit from aspects of the present invention. This invention, will be of even greater benefit in display technologies that have cells that are thin enough to provide capacitive losses when cycling individual light-emitting elements from on to off as the ability to simultaneously drive multiple groups of multiple row electrodes as discussed in the present invention reduces the losses associated with charging and discharging the capacitance of the display. Within this invention the capacitive losses are reduced as the peak instantaneous current, and therefore the peak instantaneous voltage across any capacitor, that is required to produce the desired luminance from any light-emitting element is reduced since each light-emitting element can emit light for a longer period of time than would be possible if multiple groups of multiple lines were not driven as described.

To illustrate the impact of the present invention, the following examples are provided.

EXAMPLE 1

Comparative

In this example, a display having two tiles 20, 22, each tile having 120 row electrodes 32 and 240 column electrodes 34 will be assumed. Further, it will be assumed that each tile has its own row driver and column driver. Further, each tile will have its own controller 42 and each controller will receive only the portion of the input image signal 44 that corresponds to the spatial locations of the light-emitting elements 36 within the tile 20, 22 that it controls. Therefore, the two controllers will not be able to respond to changes in luminance within the input image signal that occur in the input image signal that correspond to the spatial location of light-emitting elements in the adjacent tile. This design is consistent with prior art embodiments, in which the input image signal is parsed and delivered to each tile for rendering.

The input image signal 44 will include information for rendering two dark gray bars on a white background. The dark gray bars will each include a line of text and the second dark gray bar will begin just a few rows below the boundary between the two adjacent EL tiles. Therefore, there will be a sudden luminance change very near the boundary 54 between the two tiles 20, 22. In this example, it will be assumed that a processing unit in each of the two controllers will sharpen the input image signal 44 during the processing step to provide it for display on a multiline addressed EL display. It will then be assumed that the row and column drivers will display this processed input image signal one row at a time, by activating multiple row electrodes at a time. Within this example, the sharpening step will be completed separately by each controller, which will apply a 15 element kernel including of the elements −1, 2, 1, −2, 0, −18, −9, −18, −2, 1, 2, −1 to the input image signal. The image will then be displayed in such a way that the row drivers each activate 9 row electrodes simultaneously and allow the following proportions of current to flow through each of the 9 row electrodes: 0.16, 0.32, 0.52, 0.200, 0.400, 0.200, 0.052, 0.032, 0.16. In this way, the display draws the image 9 rows at a time. Further, exactly 9 row electrodes are active within each tile during every field and therefore, this embodiment does not employ the first exception of the present invention. It will be assumed that the appropriate portion of each image is drawn in each tile simultaneously.

Figure 6:
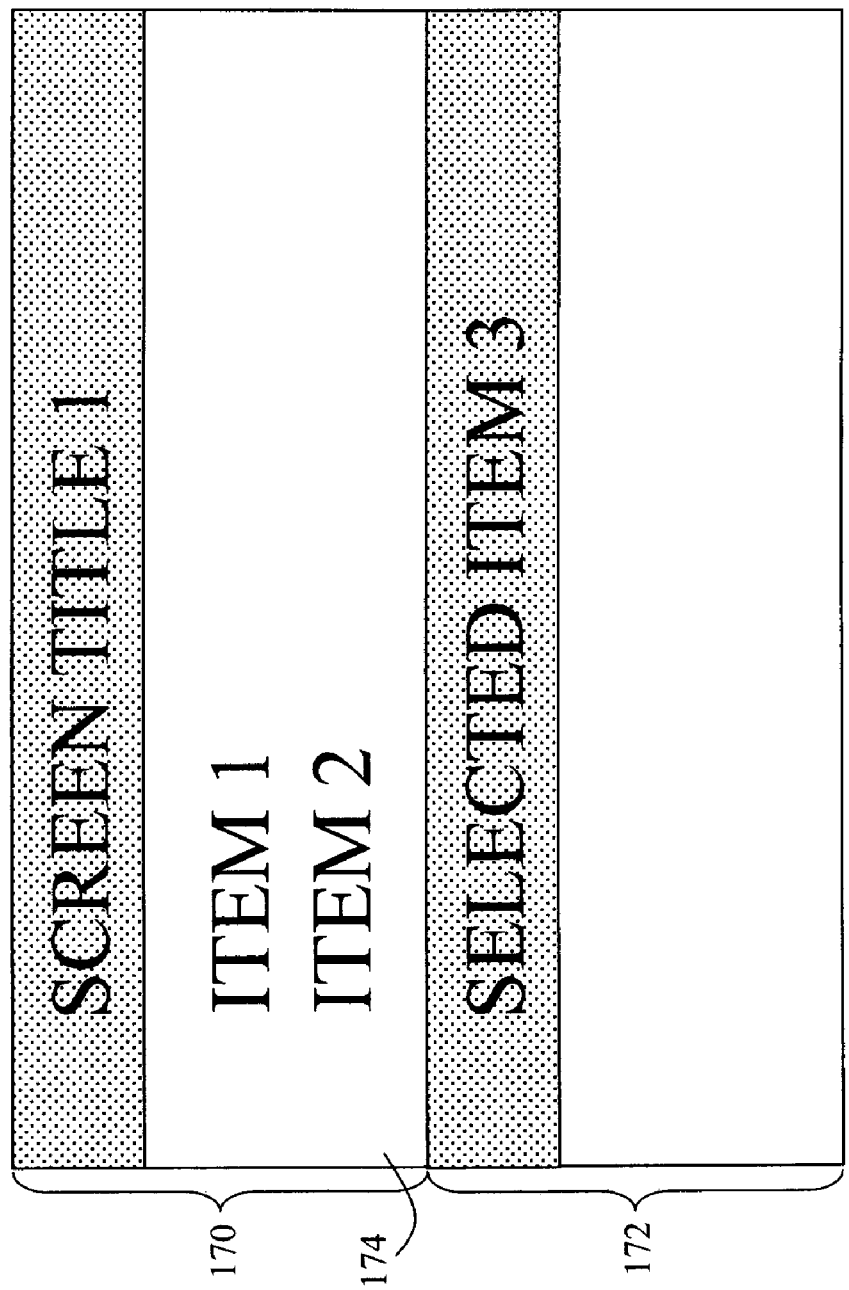
FIG. 6 is a simulated image of a tiled, passive-matrix EL display employing multi-line addressing as discussed in the prior art.
Figure 7:
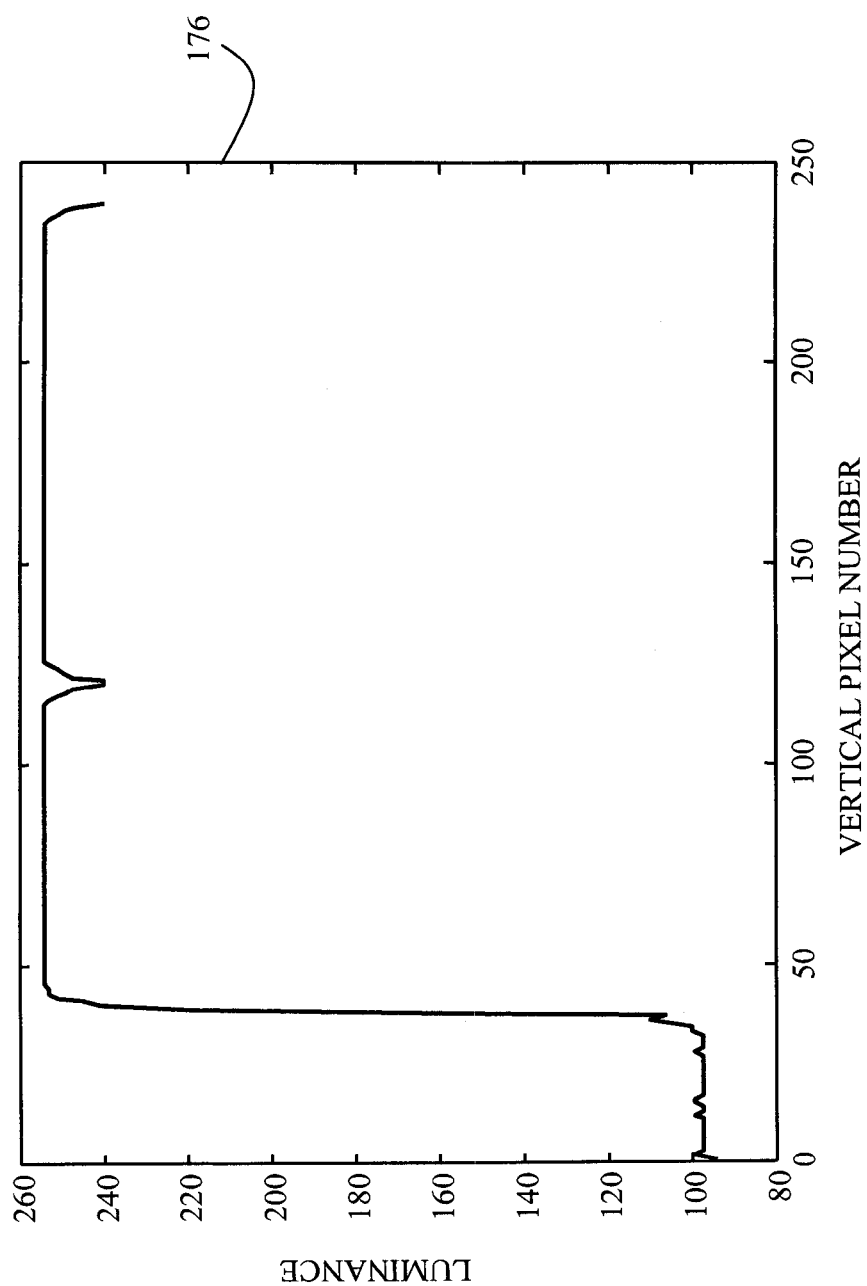
FIG. 7 is a luminance trace of the first column of the image in FIG. 6 showing an unintended luminance trough.

The resulting image is shown in FIG. 6. This image includes a first portion 170, which is rendered on the first tile and a second portion 172, which is rendered on the second tile. Because the system of the prior art renders the information in the input image signal on the two tiles independently, without knowledge of the content on the neighboring tile, a line 174 of incorrect luminance is rendered near the boundary between the two tiles. Depending upon the viewing conditions and the image content, artifacts, such as this unintended line, can be quite objectionable. To further illustrate this error, FIG. 7 shows a trace of the luminance along the first column of the display. Ideally, the luminance would be uniform over vertical pixel numbers 0 through 40 at a low level and then be uniform over the vertical pixel numbers 41 through 240 at a higher level. As this figure, shows, however, the luminance trace has an unintended luminance trough 176, which is near the boundary between the two tiles. This luminance trough forms the unintended luminance variation and therefore the artifact near the boundaries between the two tiles.

EXAMPLE 2

Inventive

In this example, a tiled, passive-matrix, EL display is created according to an embodiment of the present invention. It includes two EL tiles, each EL tile including an array of 120 rows and 240 columns of light-emitting elements, each light-emitting element being formed from a light-emitting layer that is sandwiched between an orthogonal array of row and column electrodes. The tiled, passive-matrix, EL display includes at least one row and column driver for controlling the flow of electrons between the row and column electrodes within each tile to control the emission of light from each of the light-emitting elements within each tile. The tiled, passive-matrix, EL display further is assumed to include one controller coupled to the row and column drivers for receiving an input image signal and for simultaneously providing a predetermined number of row drive signals to two or more row drivers within the two or more EL tiles, with a first exception that when the boundary between the two tiles is to be illuminated, then the number of row drive signals is less than the predetermined number within one tile.

Therefore, this display is similar to the display of the previous example, with the exception that each tile is driven in a way that is dependent upon the input image signal that corresponds to the spatial location of light-emitting elements within neighboring EL tiles. Further, at times, a portion of the image is displayed by sharing the 9 active row electrodes between the two tiles in a subset of the fields, as opposed to having 9 active row electrodes within each independent EL tile during every field, as was the case in the previous example. The same sharpening and row driving scheme, with the exception of the number of active rows that are simultaneously driven are fewer within any tile when the boundary between the two tiles is illuminated.

Figure 8:
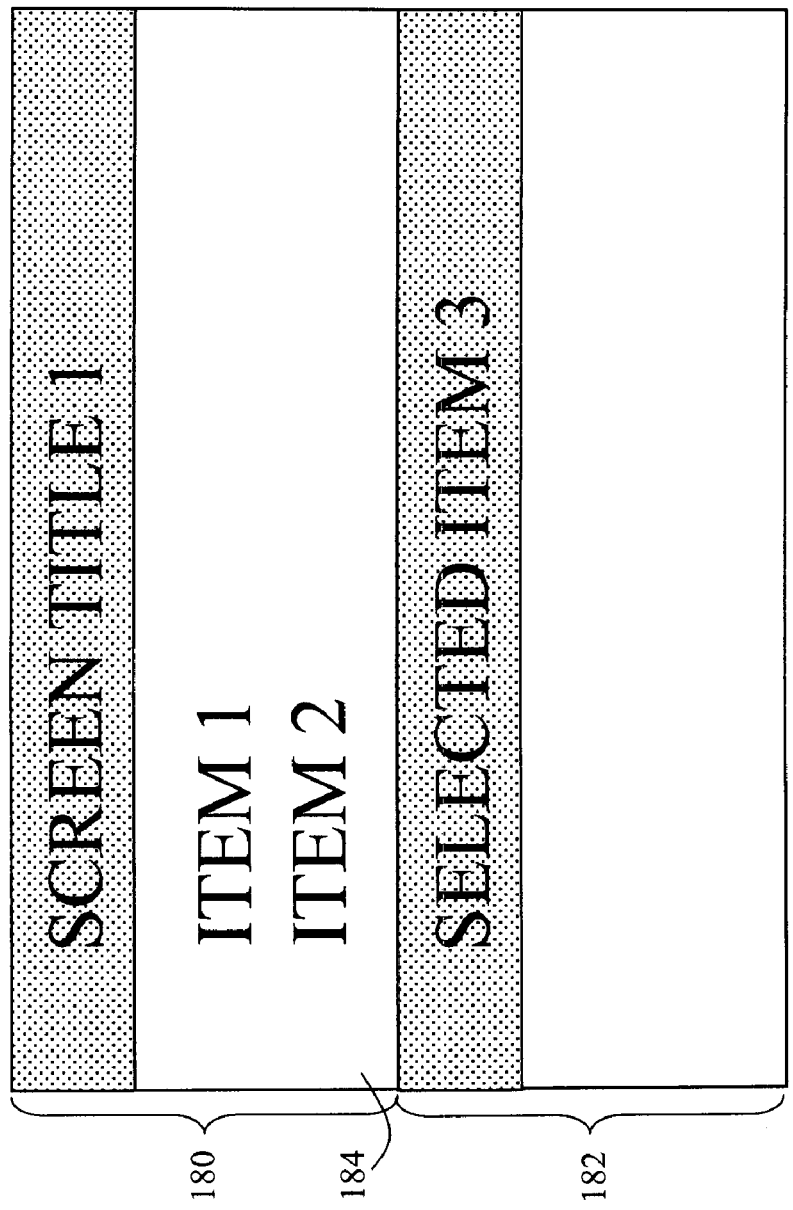
FIG. 8 is a simulated image of a tiled, passive-matrix EL display employing multiline addressing according to one embodiment of the present invention.
Figure 9:
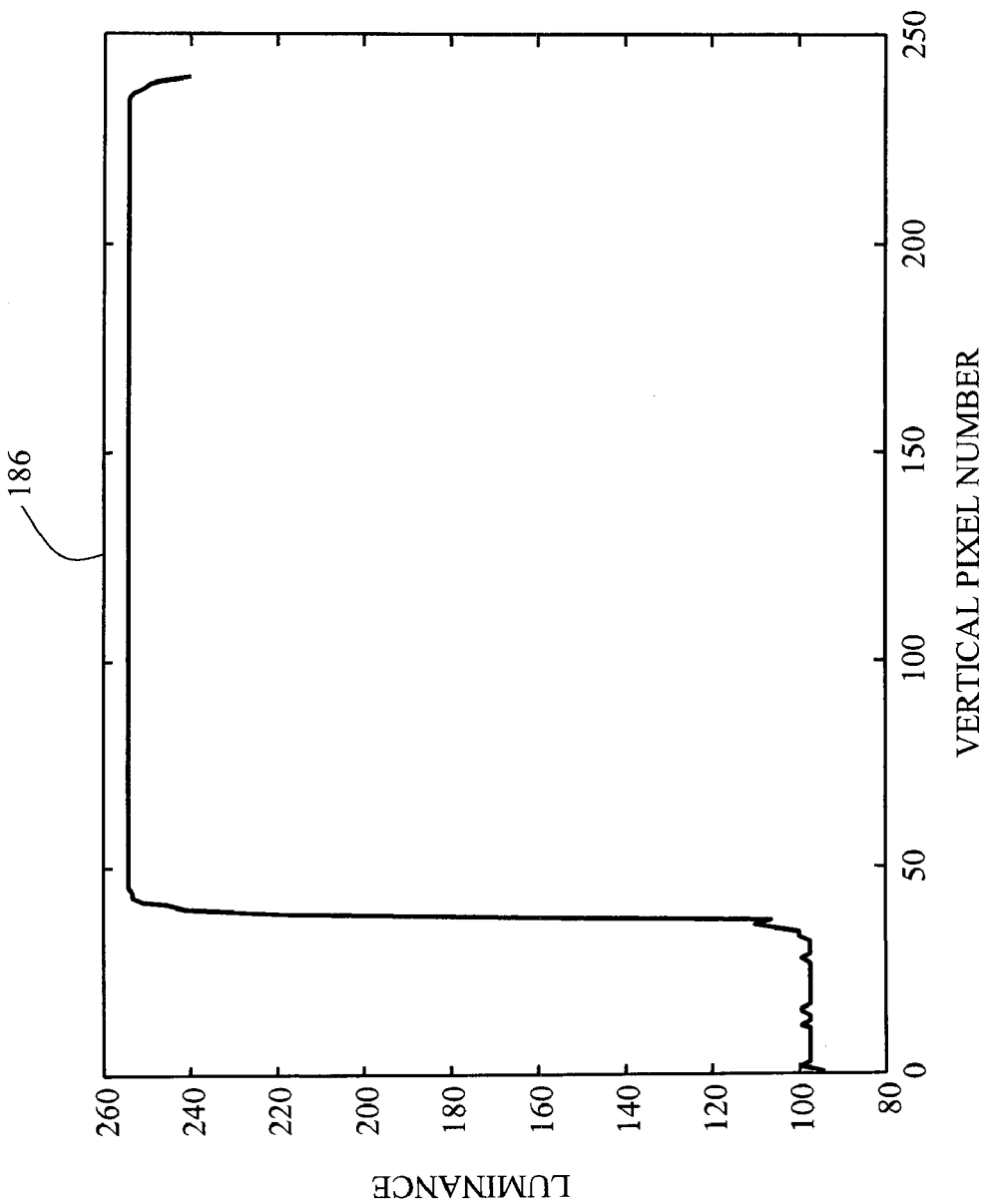
FIG. 9 is a luminance trace of the first column of the image in FIG. 8 showing the absence of the unintended luminance trough.

The resulting image is shown in FIG. 8. This image includes a first portion 180, which is rendered on the first tile and a second portion 182, which is rendered on the second tile. Note that the luminance of the top white field is uniform at the boundary 184, such that the artifact that existed in the comparative example is not present within this embodiment of the present invention. To further illustrate that the luminance artifact does not exist, FIG. 9 shows a trace of the luminance along the first column of the display. Ideally, the luminance would be uniform over vertical pixel numbers 0 through 40 at a low level and then be uniform over the vertical pixel numbers 41 through 240 at a higher level. As this figure, shows the luminance is uniform between vertical pixel numbers around 40 and at least 230. Therefore, the unintended luminance trough that was present in FIG. 7 is not present near the location 186 of the boundary between the two tiles within this embodiment.

The invention has been described in detail with particular reference to certain preferred embodiments thereof, but it will be understood that variations and modifications can be effected within the spirit and scope of the invention.

PARTS LIST 14 edge opposite to the boundary
16 edge opposite to the boundary
18 bottom row electrode
20 EL tile
22 EL tile
24 row driver
26 row driver
28 column driver
30 column driver
32 row electrode
34 column electrode
36 light-emitting element
38 group of two or more rows of light-emitting elements
40 group of light-emitting elements
42 controller
44 input image signal
54 boundary
56 group of two or more rows of light-emitting elements
58 group which bridges a boundary between adjacent tiles
60 input buffer
62 preprocessing unit
64 programmable memory unit
66 processing unit
68 output buffer
70 timing generator
72 data selector
74 row drive signal generator
100 substrate
102 driver connection
104 driver connection
106 driver connection
108 metal tile connector
110 metal tile connector
112 insulating layer
114 insulating layer
116 island of ITO
118 island of ITO
120 island of ITO
122 input image signal
124 controller
126 column driver
128 row driver
130 row driver
132 row driver
134 display
136 row electrodes
138 EL tile
140 EL tile
142 EL tile
150 substrate
152 metal tile connector
154 metal tile connector
156 insulating layer
158 ITO layer
160 electro-luminescent layer
162 metal layer
170 first portion
172 second portion
174 line artifact
176 unintended luminance trough
180 first portion
182 second portion
184 boundary
186 location of the boundary

The invention claimed is:

1. A tiled, passive-matrix, EL display, including:
    a) two or more EL tiles, each EL tile including an array of rows and columns of light-emitting elements, each light-emitting element being formed from a light-emitting layer that is sandwiched between an orthogonal array of row and column electrodes wherein each of the two or more EL tiles further include at least one row driver;
    b) at least one column driver for operating in conjunction with each of the at least one row drivers to control the flow of electrons between the row and column electrodes to control the emission of light from each of the light-emitting elements; and
    c) one or more controllers coupled to the row drivers and column driver(s) for receiving an input image signal and for simultaneously providing row drive signals to the two or more drivers within the two or more EL tiles to control the flow of electrons through the row and column electrodes to simultaneously illuminate a group of a predetermined number of rows of light-emitting elements within each EL tile during a time interval, wherein in each EL tile, the groups of illuminated rows of light-emitting elements in two subsequent time intervals are selected with no overlap with a first exception that when the boundary between the two tiles is to be illuminated, then the number of illuminated rows of light-emitting elements in the present group is less than the predetermined number, and the present group of illuminated rows of light-emitting elements overlaps the previous group of illuminated rows of light-emitting elements.

2. The tiled, passive-matrix, EL display of claim 1, wherein there are at least two EL tiles having the boundary between the at least two EL tiles and two tiles having an edge opposite to the boundary, with a second exception that when simultaneously illuminating the opposite edges of each tile, then the number row drive signals is less than the predetermined number within one tile.

3. The tiled, passive-matrix, EL display of claim 1, wherein each controller processes the input image signals before their application to the row and column drivers.

4. The tiled, passive-matrix, EL display of claim 3, wherein each controller sharpens or decomposes the image signal.

5. The tiled, passive-matrix, EL display of claim 1, wherein the luminance level of a light-emitting element within a group of simultaneously activated light-emitting elements corresponding to the intersection of a column electrode with a plurality of row electrodes and produces light that is brighter than the other light-emitting elements within the group.

6. The tiled, passive-matrix, EL display of claim 1, wherein there are a plurality of fields for each image and wherein there is at least one light-emitting element within each tile that emits light during each field.

7. The tiled, passive-matrix, EL display of claim 1, wherein the EL display includes a single controller.

8. The tiled, passive-matrix, EL display of claim 1, wherein the controller(s) receives the input image signal and applies a correction for luminance or color variations, between adjacent tiles prior to determining the row and column drive signals.

9. The tiled, passive-matrix, EL display of claim 1, wherein the total of the number of rows of light-emitting elements that are simultaneously illuminated on the display, are equal to the predetermined number of row drive signals when the boundary is illuminated.

10. The tiled, passive-matrix, EL display of claim 1, wherein at least a portion of the two or more tiles, are formed on a single substrate.

11. The tiled, passive-matrix, EL display of claim 10, wherein the two or more tiles, provide column connectors at one edge of the substrate.

12. The tiled, passive-matrix, EL display of claim 10, wherein the display includes at least one metal tile connector, which extends through an EL tile to provide a connection to a column driver.

13. The tiled, passive-matrix, EL display of claim 10, wherein the display is comprised of at least three tiles.

14. The tiled, passive-matrix, EL display of claim 10, wherein the tiled, passive-matrix, EL display includes metal tile connectors for connecting two or more EL tiles to a single column driver.

15. The tiled, passive-matrix, EL display of claim 10, wherein the two or more tiles are simultaneously coated.

16. The tiled, passive-matrix, EL display of claim 10, wherein the widths of the metal tile connectors for connecting different EL tiles, differ as a function of the length of the EL tile from the column driver.

17. The tiled, passive-matrix, EL display of claim 10, wherein the tiled, passive-matrix, EL display is comprised of three or more tiles.

* * * * *